US012796103B2

(12) United States Patent
Takahashi et al.

(10) Patent No.: US 12,796,103 B2
(45) Date of Patent: Nov. 10, 2026

(54) DESIGNING METHOD OF SEMICONDUCTOR INTEGRATED CIRCUIT DEVICE, SEMICONDUCTOR INTEGRATED CIRCUIT DEVICE, AND NON-TRANSITORY COMPUTER-READABLE RECORDING MEDIUM

(71) Applicant: Socionext Inc., Kanagawa (JP)

(72) Inventors: Kengo Takahashi, Kanagawa (JP); Yuji Takahashi, Kanagawa (JP)

(73) Assignee: Socionext Inc., Yokohama (JP)

( * ) Notice: Subject to any disclaimer, the term of this patent is extended or adjusted under 35 U.S.C. 154(b) by 767 days.

(21) Appl. No.: 18/323,244

(22) Filed: May 24, 2023

(65) Prior Publication Data

US 2023/0299070 A1 Sep. 21, 2023

Related U.S. Application Data

(63) Continuation of application No. PCT/JP2020/044262, filed on Nov. 27, 2020.

(51) Int. Cl.
*H10D 89/10* (2025.01)
*H10D 84/00* (2025.01)

(52) U.S. Cl.
CPC ............. *H10D 89/10* (2025.01); *H10D 84/00* (2025.01)

(58) Field of Classification Search
CPC ............................... H10D 89/10; H10D 84/00
USPC .......................................................... 716/119
See application file for complete search history.

(56) References Cited

U.S. PATENT DOCUMENTS

RE43,912 E 1/2013 Ogata
8,413,095 B1 * 4/2013 Dubuque ............ G06F 30/3323 716/108
8,549,457 B1 * 10/2013 Moore .................. G06F 30/392 716/119
8,656,332 B2 * 2/2014 Fleischer .............. G06F 30/392 716/108
(Continued)

FOREIGN PATENT DOCUMENTS

JP H06-045440 A 2/1994
JP 2005-259879 A 9/2005
(Continued)

OTHER PUBLICATIONS

International Search Report (ISR) dated Feb. 16, 2021 issued in International Patent Application No. PCT/JP2020/044262, with English translation.

*Primary Examiner* — Suresh Memula
(74) *Attorney, Agent, or Firm* — Rimon P.C.

(57) ABSTRACT

A designing method of a semiconductor integrated circuit device includes: arranging a plurality of macros within a circuit arrangement area of a semiconductor integrated circuit device in which a plurality of power switch circuits are to be arranged in accordance with a first rule; detecting a narrow area from a first area, a width of the narrow area being less than a first value, the first area being an area in which the macros are not arranged within the circuit arrangement area; arranging the power switch circuits in the detected narrow area in accordance with a second rule different from the first rule; and arranging the power switch circuits in an area other than the narrow area within the first area in accordance with the first rule.

20 Claims, 12 Drawing Sheets

(56) References Cited

U.S. PATENT DOCUMENTS 8,914,765 B2 * 12/2014 Sigal ..................... G06F 30/394 716/120
RE48,373 E 12/2020 Ogata
RE48,694 E 8/2021 Ogata
11,663,389 B2 * 5/2023 Peng ..................... G06F 30/394 716/119
11,663,392 B2 * 5/2023 Lin ....................... G06F 30/394 716/110
11,727,183 B2 * 8/2023 Biswas ................. G06F 30/392 716/120
11,755,809 B2 * 9/2023 Yu ......................... G06F 30/392 716/120
11,763,052 B2 * 9/2023 Ayyagari .............. G06F 30/367 716/106
11,790,150 B2 * 10/2023 Sherlekar .............. G06F 30/398 716/111
2005/0200383 A1 9/2005 Ogata
2007/0241779 A1 10/2007 Ogata
2007/0241790 A1 10/2007 Ogata
2008/0222588 A1 * 9/2008 Nonaka ................. G06F 30/392 716/122
2008/0246108 A1 10/2008 Sakurabayashi
2009/0072888 A1 3/2009 Ogata
2009/0079469 A1 3/2009 Ogata
2011/0024869 A1 * 2/2011 Nakajima .............. H10D 89/10 700/121
2011/0102076 A1 5/2011 Ogata
2012/0256683 A1 10/2012 Ogata
2013/0042216 A1 * 2/2013 Loh ....................... G06F 30/373 716/119
2013/0198711 A1 * 8/2013 Yang ..................... G06F 30/392 716/115
2014/0089883 A1 * 3/2014 Suzuki .................. G06F 30/392 716/122
2014/0189613 A1 * 7/2014 Tomblin ................ G06F 30/398 716/55
2014/0232448 A1 8/2014 Ogata
2014/0282344 A1 * 9/2014 Hsu ....................... G06F 30/392 716/123
2015/0194955 A1 7/2015 Ogata
2016/0156349 A1 6/2016 Ogata
2017/0331472 A1 11/2017 Ogata
2019/0081029 A1 3/2019 Okamoto et al.
2019/0123741 A1 4/2019 Okamoto et al.
2023/0130642 A1 * 4/2023 Das ....................... G06F 30/392 716/120
2023/0205962 A1 * 6/2023 Zhao ..................... G06F 30/392 716/120
2023/0297748 A1 * 9/2023 Gore ..................... G06F 30/347 716/117

FOREIGN PATENT DOCUMENTS

JP 2007-258226 A 10/2007
JP 2008-277788 A 11/2008
JP 2009-076501 A 4/2009
JP 2011-222895 A 11/2011
WO 2017/208887 A1 12/2017
WO 2017/208888 A1 12/2017

* cited by examiner

DESIGNING METHOD OF SEMICONDUCTOR INTEGRATED CIRCUIT DEVICE, SEMICONDUCTOR INTEGRATED CIRCUIT DEVICE, AND NON-TRANSITORY COMPUTER-READABLE RECORDING MEDIUM

CROSS-REFERENCE TO RELATED APPLICATION

This application is a continuation application of International Application PCT/JP2020/044262 filed on Nov. 27, 2020, and designated the U.S., the entire contents of which are incorporated herein by reference.

FIELD

The embodiments discussed herein are directed to a designing method of a semiconductor integrated circuit device, a semiconductor integrated circuit device, and a non-transitory computer-readable recording medium.

BACKGROUND

One of the techniques for achieving a reduction in power consumption of semiconductor integrated circuit devices is a power gating technique. The power gating technique is a technique that divides the internal circuitry of a semiconductor integrated circuit device into a plurality of power domains (circuit blocks) and reduces leakage current that leads to an increase in power consumption by shutting off power to non-operating power domains. The power gating technique uses a power switch circuit that controls switching between connection and disconnection between a global power supply line provided for the entire circuit arranged on a chip and a local power supply line provided for circuits of the power domain.

As illustrated in FIG. 9A, Patent Document 1 discloses a configuration in which a plurality of power switch circuits (PSW) 902 are arranged in a staircase pattern for a power domain that controls power in a semiconductor integrated circuit device 901. A plurality of the power switch circuits 902 are arranged at regular intervals in the horizontal direction, and are arranged to be displaced in position from a column of the adjacent power switch circuits 902 in the vertical direction.

When a plurality of the power switch circuits 902 are arranged in a regular arrangement pattern as illustrated in FIG. 9A, there is the following problem. When macros (functional circuits) that achieve a predetermined function are arranged in the semiconductor integrated circuit device, the power switch circuits sometimes fail to be arranged in the same arrangement pattern depending on the arrangement of the macros. For example, as illustrated in FIG. 9A, when macros 903 are arranged in the semiconductor integrated circuit device 901, power switch circuits 902A, which do not overlap with the macro 903 in the arrangement position, can be arranged according to a predetermined arrangement pattern, but power switch circuits 902B, which overlap with the macro 903 in the arrangement position, are not able to be arranged. If the power switch circuits 902B are not arranged, the power supply voltage fluctuation (IR-Drop) during operation in that circuit area increases, failing to satisfy the constraints (criteria) or supply power to that circuit area in some cases. The occurrence of such a constraint violation (criteria violation) of the power supply voltage fluctuation (IR-Drop), or the like causes rework working in the process of designing the semiconductor integrated circuit device.

As a method of avoiding this problem, as illustrated in FIG. 9B, there is considered a method of arranging the power switch circuits 902 by displacing the arrangement positions of the power switch circuits 902 that are not arranged when following a predetermined arrangement pattern. In FIG. 9B, in the portion surrounded by the dashed line, the power switch circuits 902 are arranged in a sliding manner so as not to overlap with the macro 903 in the arrangement position. In this way, it may be possible to suppress the power supply voltage fluctuation (IR-Drop) during operation and satisfy the constraints (criteria), but as a result, the power switch circuits 902 and corresponding global power supply lines 911 and local power supply lines 912 are provided in a narrow area between the macros 903. Therefore, a usable standard cell area is reduced, and wiring resources that can be used for wiring for signals input/output to/from the standard cell or macro, wiring for signals passing therethrough, or the like are also reduced. The reduction in the usable standard cell area and wiring resources increases the possibility of causing the rework working to occur in the process of designing the semiconductor integrated circuit device.

[Patent Document 1] International Publication Pamphlet No. WO 2017/208888

SUMMARY

One aspect of the designing method of the semiconductor integrated circuit device includes: arranging a plurality of macros within a circuit arrangement area of a semiconductor integrated circuit device in which a plurality of power switch circuits are to be arranged in accordance with a first rule; detecting a narrow area from a first area, a width of the narrow area being less than a first value, the first area being an area in which the macros are not arranged within the circuit arrangement area; arranging the power switch circuits in the detected narrow area in accordance with a second rule different from the first rule; and arranging the power switch circuits in an area other than the narrow area within the first area in accordance with the first rule.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

There will be explained embodiments below based on the drawings.

A semiconductor integrated circuit device to be designed in the embodiments explained below is a semiconductor integrated circuit device having power domains in which control related to power supply is performed. In the power domain, a power switch circuit (PSW) is provided to control the connection state between a global power supply line provided for the entire circuit, which is arranged on a chip, and a local power supply line provided for circuits in the power domain, and is configured in which whether or not to electrically connect the global power supply line and the local power supply line is switchable by a control signal. The power supplied by the global power supply line is supplied to the circuits in the power domain through the local power supply line connected via the power switch circuit.

The global power supply line, the local power supply line, and the power switch circuit may be provided on the power supply potential side, or may be provided on the ground potential side. There will be explained below, as an example, the case where a global power supply line that supplies a power supply potential and a local power supply line that supplies a power supply potential are provided, and a power switch circuit is provided between the global power supply line and the local power supply line.

First Embodiment

There is explained a first embodiment.

Figure 1:
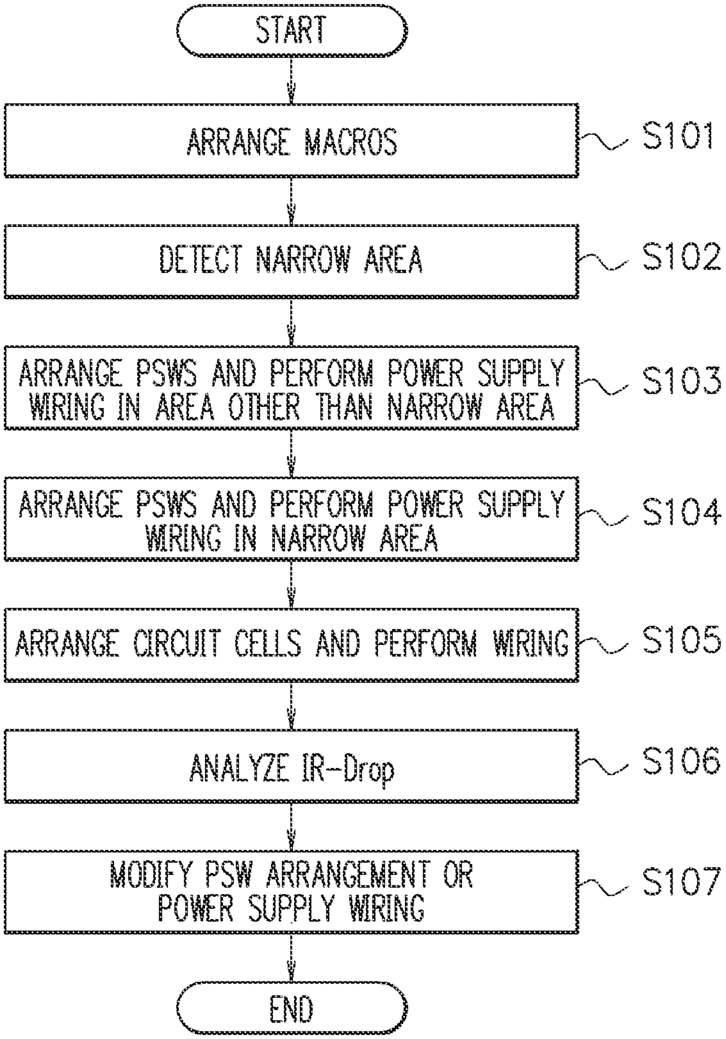
FIG. 1 is a view explaining the outline of a designing method of a semiconductor integrated circuit device in this embodiment.

FIG. 1 is a view explaining the outline of a designing method of a semiconductor integrated circuit device in this embodiment. The designing method of the semiconductor integrated circuit device in this embodiment can be implemented by, for example, a computer (designing device), and each processing of the designing method of the semiconductor integrated circuit device in this embodiment is executed by a processor (CPU, or the like) thereof.

At step S101, the processor arranges macros (functional circuits) in a circuit arrangement area of the semiconductor integrated circuit device based on design data including logic circuit information and a netlist read from an external storage device, or the like. The macro is a designed circuit block that implements a certain function, which is, for example, a memory macro, or the like.

Then, at step S102, the processor detects a narrow area in the circuit arrangement area in which the macros are arranged. Here, the narrow area is, for example, an area where within an area with no arrangement of macros (standard cell arrangement area) within the circuit arrangement area, the distance between the macros or the distance between the macro and the outer edge of the circuit arrangement area is smaller than a certain value.

Figure 9A:
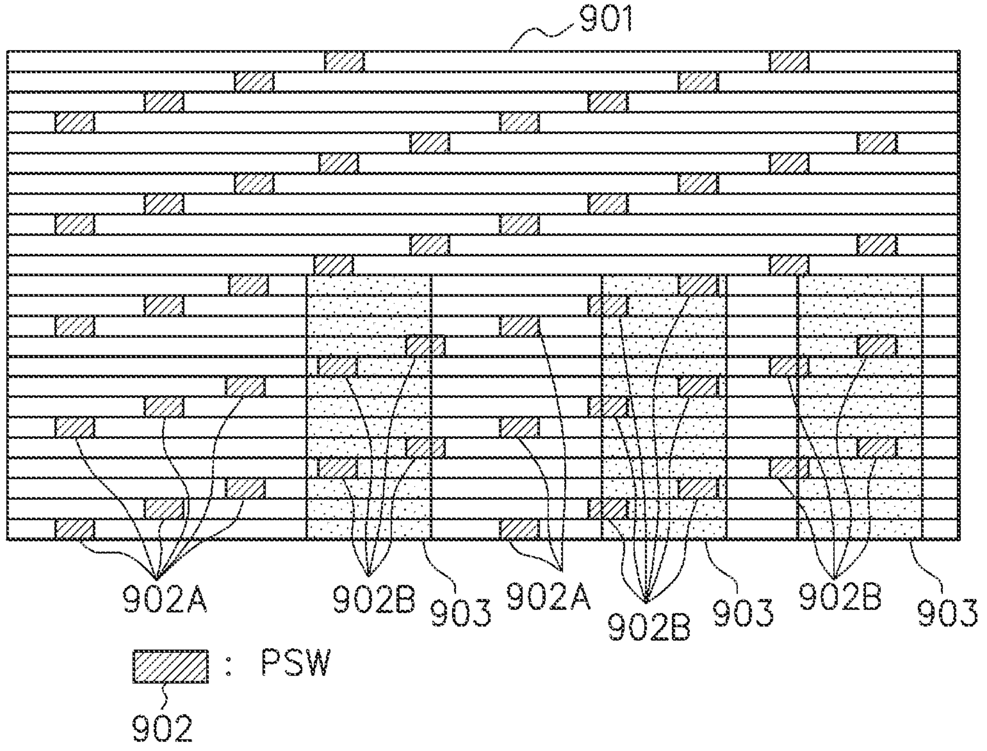
FIG. 9A is a view explaining an arrangement example of power switch circuits in a semiconductor integrated circuit device.
Figure 9B:
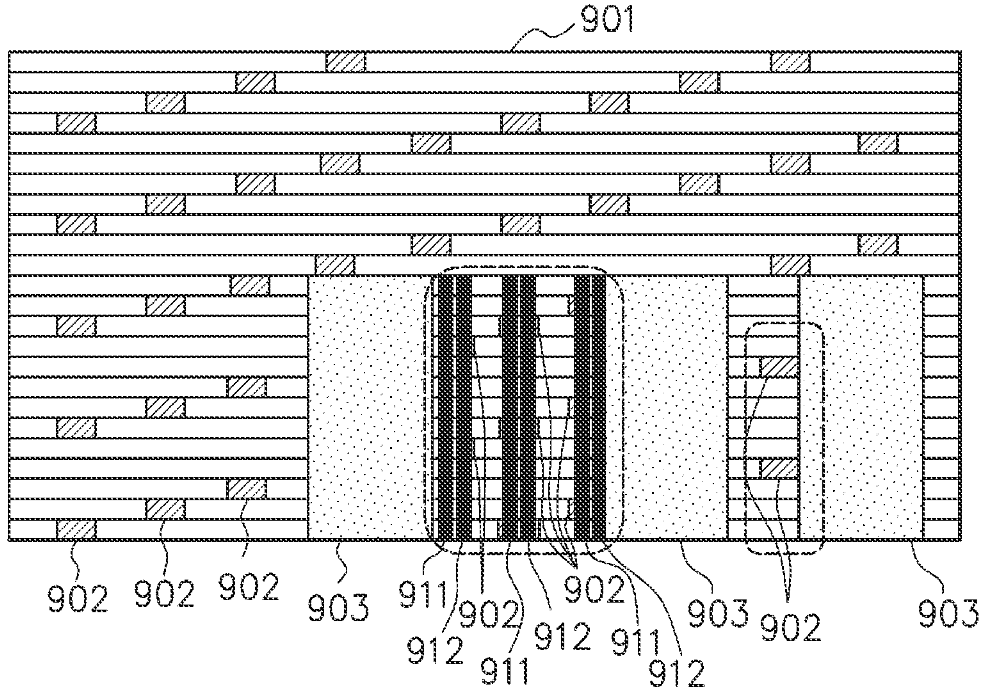
FIG. 9B is a view explaining another arrangement example of the power switch circuits in the semiconductor integrated circuit device.

Then, at step S103 and step S104, the processor arranges power switch circuits (PSW) in the area with no arrangement of macros (standard cell arrangement area) within the circuit arrangement area and performs wiring related to the power supply (power supply wiring). At step S103, the processor arranges power switch circuits in accordance with the first rule and performs power supply wiring in the area other than the narrow area detected at step S102. The arrangement pattern in accordance with the first rule is such a staircase arrangement pattern as illustrated in FIG. 9A, for example. At step S104, the processor arranges power switch circuits in accordance with the second rule different from the first rule and performs power supply wiring in the narrow area detected at step S102. Incidentally, the execution order of step S103 and step S104 is random, and after arranging the power switch circuits and performing the power supply wiring in the narrow area, arranging the power switch circuits and performing the power supply wiring in the area other than the narrow area may be executed.

Then, at step S105, the processor arranges circuit cells (standard cells, or the like) in the standard cell arrangement area within the circuit arrangement area based on the design data, and performs wiring of signal lines, or the like.

Then, at step S106, the processor analyzes a power supply voltage fluctuation (IR-Drop) during operation in the semiconductor integrated circuit device in which the macros and the circuit cells are arranged within the circuit arrangement area based on the design data and the power supply wiring and the signal line wiring are performed. The processing to analyze the power supply voltage fluctuation (IR-Drop) during operation in the semiconductor integrated circuit device may be performed using a well-known technique.

Then, at step S107, the processor performs modification of the arrangement of the power switch circuits or the power supply wiring, or another processing according to the results of the power supply voltage fluctuation (IR-Drop) analysis performed at step S106, or other factors. For example, when a constraint violation (criteria violation) occurs in the power supply voltage fluctuation (IR-Drop) analysis at step S106, the processor modifies the arrangement of the power switch circuits or the power supply wiring so as to resolve the constraint violation (criteria violation).

Figure 2:
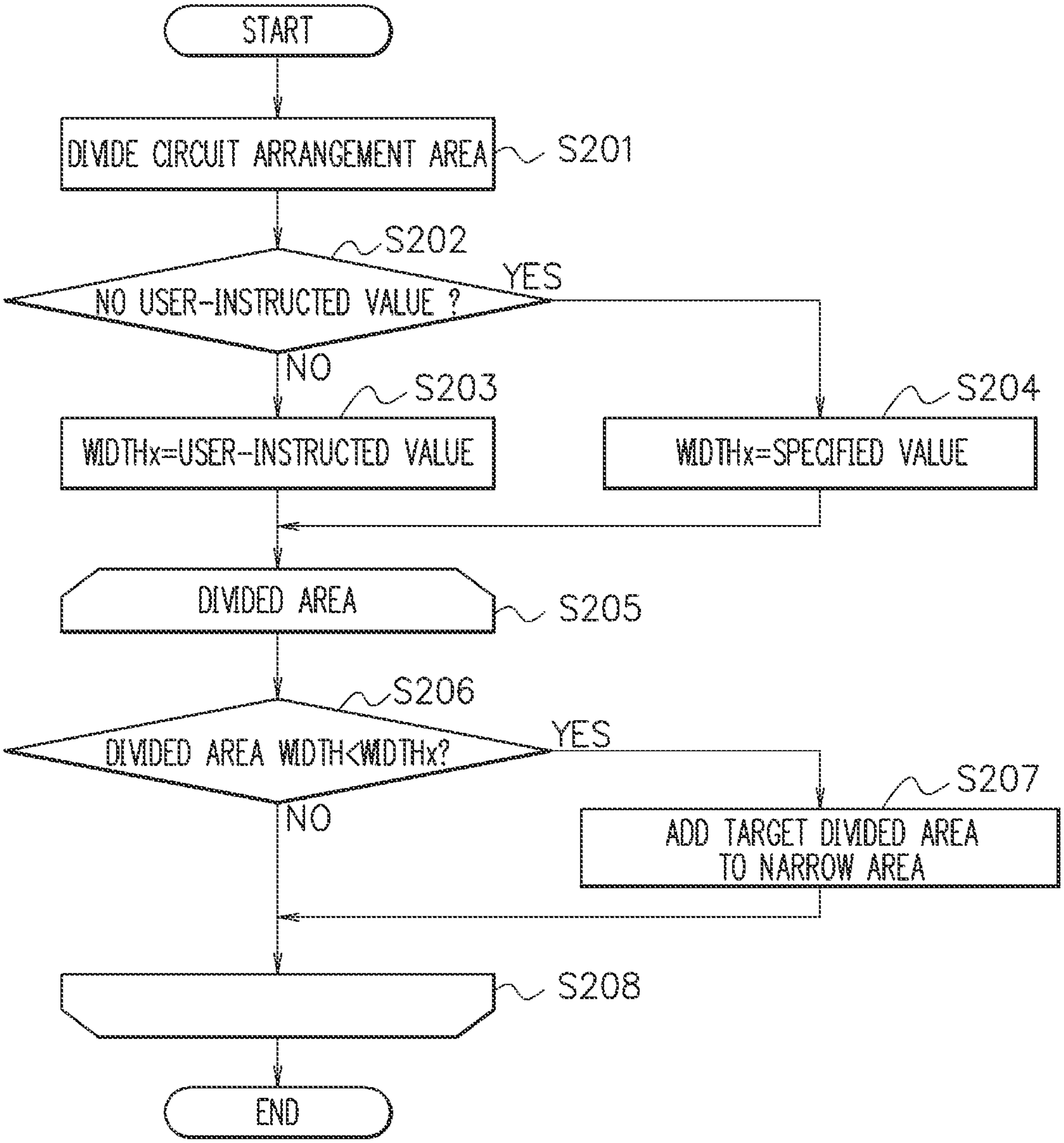
FIG. 2 is a flowchart illustrating an example of detection processing of a narrow area in this embodiment.

FIG. 2 is a flowchart illustrating an example of detection processing of the narrow area at step S102 illustrated in FIG. 1.

Figure 3A:
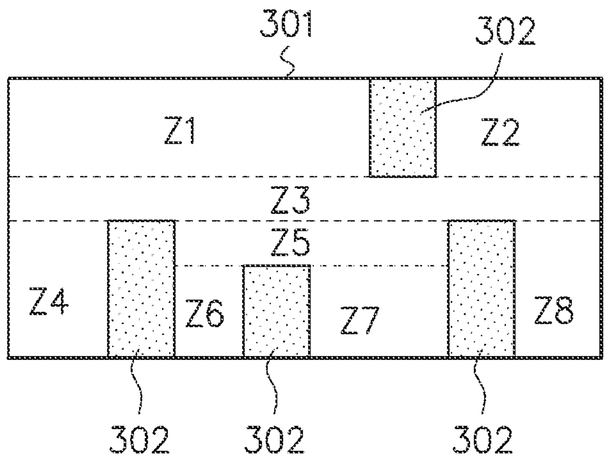
FIG. 3A is a view explaining division of a circuit arrangement area.

In the detection processing of the narrow area, first, at step S201, the processor divides the area with no arrangement of macros (standard cell arrangement area) within the circuit arrangement area in the horizontal direction. Here, the horizontal direction refers to the direction vertical to the direction in which a power supply line extends. The processor divides the standard cell arrangement area within a circuit arrangement area 301 into divided areas, each of which is a rectangle in which the right side or left side of a macro 302 or the right side or left side of the outer edge of the circuit arrangement area 301 is set as its opposite side, as illustrated in FIG. 3A as an example. In the example illustrated in FIG. 3A, the processor divides the standard cell arrangement area into eight divided areas Z1 to Z8.

Then, at step S202, the processor determines whether or not there is a user-instructed value specified in advance by a user as a threshold value used for detecting a narrow area. When determining that there is a user-instructed value (NO at step S202), the processor proceeds to step S203. When determining that there is no user-instructed value (YES at step S202), the processor proceeds to step S204.

At step S203, the processor sets a narrow area criterion width x used for determining whether or not the area is a narrow area to the user-instructed value specified in advance by the user, and proceeds to step S205.

Figure 3B:
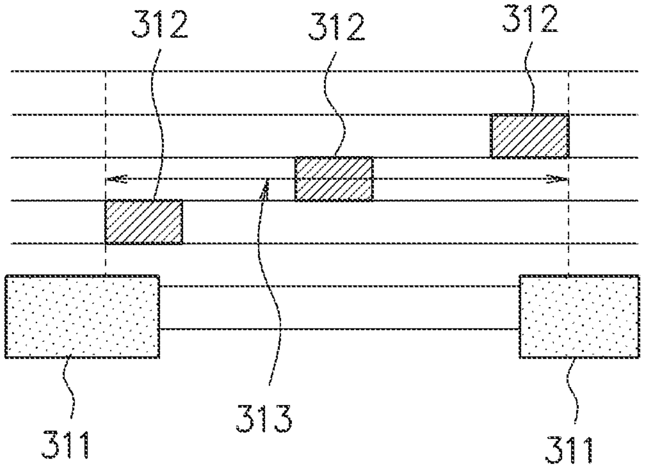
FIG. 3B is a view explaining an example of a criterion of the narrow area.

At step S204, the processor sets the narrow area criterion width x to a specified value, and proceeds to step S205. This specified value is a value defined in consideration of the pitch (arrangement interval) between the power switch circuits when the power switch circuits are arranged in accordance with the first rule. For example, as illustrated in FIG. 3B as an example, the specified value is set to a width 313 that is the sum of the width of one power switch circuit 312 and the length of twice the pitch between the power switch circuits 312. Here, the pitch is the interval between corresponding portions of adjacent power switch circuits, for example, the horizontal interval between the left sides of adjacent power switch circuits. In FIG. 3B, 311 denotes the macro (functional circuit).

Pieces of repetitive processing at steps S205 to S208 explained below are performed for each divided area divided at step S201. At step S205, the processor selects one unprocessed divided area from among the divided areas divided at step S201.

Then, at step S206, the processor determines whether or not the width of the target divided area is less than the narrow area criterion width x. When determining that the width of the target divided area is less than the narrow area criterion width x (YES at step S206), the processor proceeds to step S207. When determining that the width of the target divided area is not less than the narrow area criterion width x (NO at step S206), the processor proceeds to step S208.

At step S207, the processor registers the target divided area in a narrow area list, to thereby add the target divided area to the narrow area, and proceeds to step S208.

At step S208, the processor returns to step S205 when there is an unprocessed divided area among the divided areas divided at step S201, and the processor finishes the detection processing of the narrow area when there is no unprocessed divided area, namely, the processing is completed for all the divided areas.

Incidentally, in the previously-described detection processing of the narrow area, the standard cell arrangement area within the circuit arrangement area is divided horizontally, but it may be divided vertically (in the same direction as the direction in which the power supply line extends). In this case, the processor divides the standard cell arrangement area within the circuit arrangement area 301 into divided areas, each of which is a rectangle in which the upper side or lower side of the macro 302 or the upper side or lower side of the outer edge of the circuit arrangement area 301 is set as its opposite side, and performs the same processing as that described previously.

Figure 4A:
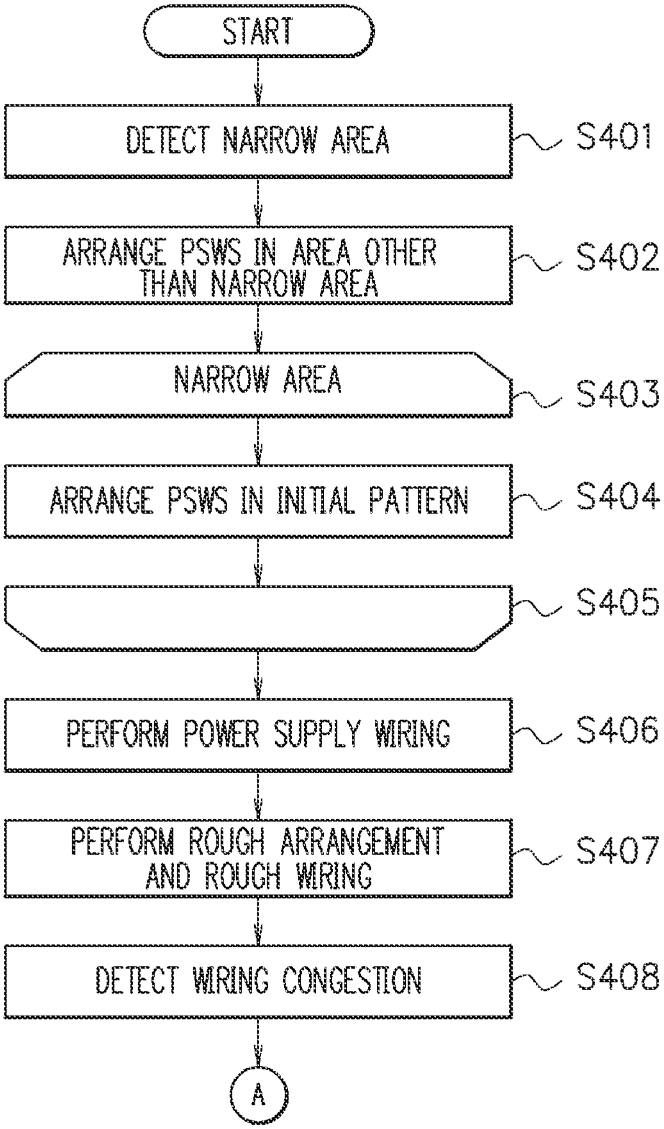
FIG. 4A is a flowchart illustrating an example of arrangement processing of power switch circuits in a first embodiment.
Figure 4B:
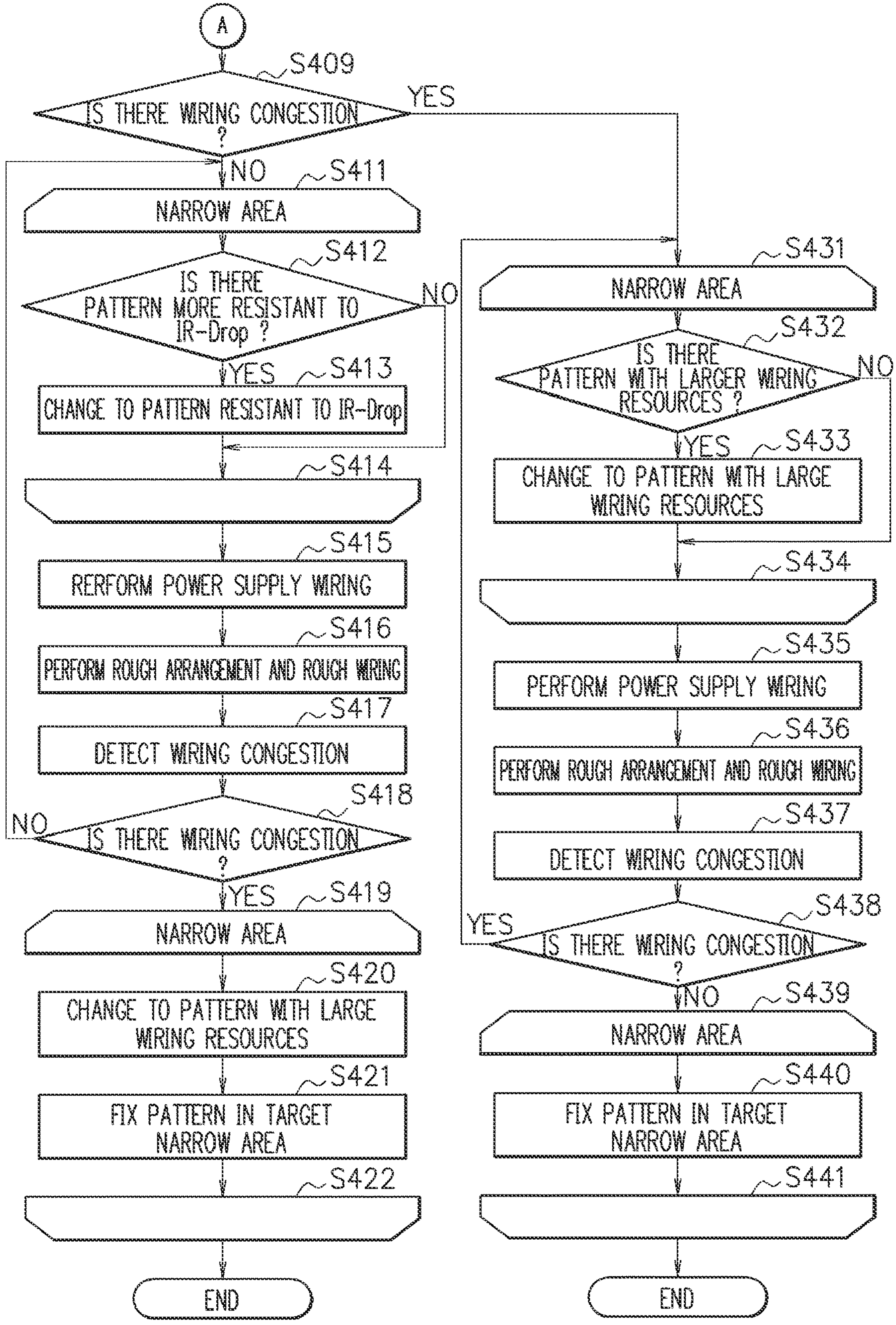
FIG. 4B is a flowchart illustrating an example of the arrangement processing of the power switch circuits in the first embodiment.

Then, with reference to FIG. 4A and FIG. 4B, there is explained arrangement processing of the power switch circuits in the first embodiment. Pieces of processing illustrated in FIG. 4A and FIG. 4B correspond to pieces of the processing at steps S102 to S104 in FIG. 1. In the first embodiment, the power switch circuits are arranged in the same arrangement pattern in all the narrow areas within the circuit arrangement area. FIG. 4A and FIG. 4B each are a flowchart illustrating an example of the arrangement processing of the power switch circuits in the first embodiment.

At step S401, the processor detects a narrow area in the circuit arrangement area of the semiconductor integrated circuit device in which the macros (functional circuits) are arranged, as illustrated in FIG. 2, for example.

At step S402, the processor refers to the narrow area list and arranges the power switch circuits in accordance with the first rule in the area other than the narrow area of the area with no arrangement of macros (standard cell arrangement area) within the circuit arrangement area. The arrangement pattern of the power switch circuits in accordance with the first rule is such a staircase arrangement pattern as illustrated in FIG. 9A, for example.

Further, by pieces of repetitive processing at steps S403 to S405, the processor arranges the power switch circuits in each of the narrow areas of the area with no arrangement of macros (standard cell arrangement area) within the circuit arrangement area. At step S403, the processor refers to the narrow area list and selects one narrow area in which the power switch circuit arrangement is not performed from among the narrow areas.

Then, at step S404, the processor arranges the power switch circuits in the target narrow area in an initial arrangement pattern. The initial arrangement pattern of the power switch circuits is an arrangement pattern in accordance with a rule different from the arrangement pattern of the power switch circuits in accordance with the first rule.

Then, at step S405, the processor returns to step S403 when there is, in the narrow area list, a narrow area in which the power switch circuit arrangement is not performed. The processor proceeds to step S406 when there is no narrow area in which the power switch circuit arrangement is not performed, namely, when the processor has arranged the power switch circuits in all the narrow areas in the narrow area list in the initial arrangement pattern.

Incidentally, the arrangement of the power switch circuits in the area other than the narrow area and the arrangement of the power switch circuits in the narrow area, which are performed at steps S402 to S405, are performed in an arbitrary order, and after the power switch circuits are arranged in the narrow area, the power switch circuits may be arranged in the area other than the narrow area.

At step S406, the processor performs power supply wiring related to the power switch circuits or the like arranged as described previously. The processor performs wiring of global power supply lines and local power supply lines that are connected to the power switch circuits to supply a power supply potential, power supply lines that supply a ground potential, and the like.

At step S407, the processor performs rough arrangement and wiring of circuit cells (standard cells, or the like), signal lines, and the like in the standard cell arrangement area within the circuit arrangement area.

Then, at Step S408, the processor performs detection processing of wiring congestion to evaluate wiring margins in the standard cell arrangement area within the circuit arrangement area in which the arrangement and the wiring are performed as described previously. In the detection processing of wiring congestion, wiring congestion is to be detected when in the area subject to the detection processing, there are lines more than the amount corresponding to the size of the area. It is assumed that the amount of lines corresponding to the size of the area is determined in advance. A well-known technique may be used to execute the detection processing of wiring congestion. After performing the detection processing of wiring congestion, the processor proceeds to step S409 illustrated in FIG. 4B.

At step S409, the processor determines whether or not there is wiring congestion in the narrow area within the circuit arrangement area. When determining that there is no wiring congestion in all the narrow areas within the circuit arrangement area (NO at step S409), the processor proceeds to step S411. When determining that there is wiring congestion in at least one narrow area within the circuit arrangement area (YES at step S409), the processor proceeds to step S431.

When determining that there is no wiring congestion in all the narrow areas, the processor arranges the power switch circuits in each of the narrow areas by changing the arrangement pattern to an arrangement pattern that is more resistant to IR-Drop (power supply voltage fluctuation) than the current arrangement pattern by pieces of repetitive processing at steps S411 to S414. That is, the processor determines whether or not there is an arrangement pattern that is more resistant to IR-Drop than the current arrangement pattern (S412). When determining that there is an arrangement pattern that is more resistant to IR-drop (YES at step S412), the processor arranges the power switch circuits in the narrow area in the arrangement pattern that is more resistant to IR-drop (that further suppresses and reduces the power supply voltage fluctuation) (S413). On the other hand, when determining that there is no arrangement pattern that is more resistant to IR-Drop (NO at step S412), the processor finishes pieces of the repetitive processing at steps S411 to S414. The arrangement pattern that is more resistant to IR-Drop is, for example, an arrangement pattern in which the number of power switch circuits to be arranged in an area is increased.

Figure 6A:
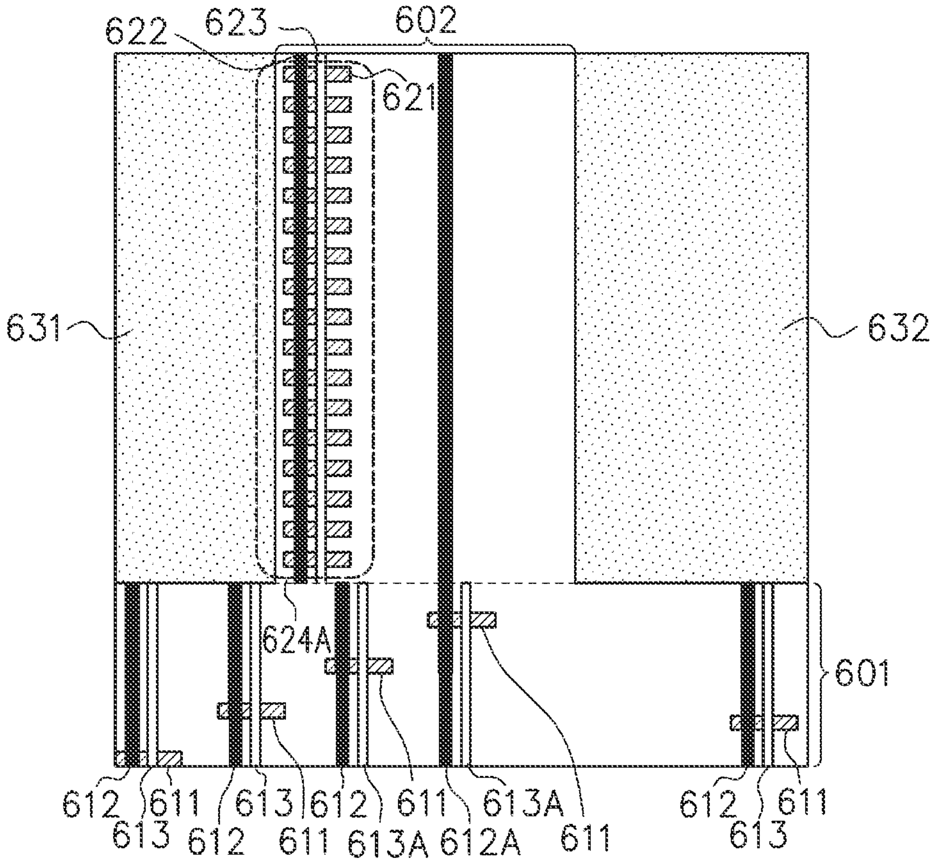
FIG. 6A is a view illustrating an example of an arrangement pattern in this embodiment.
Figure 6B:
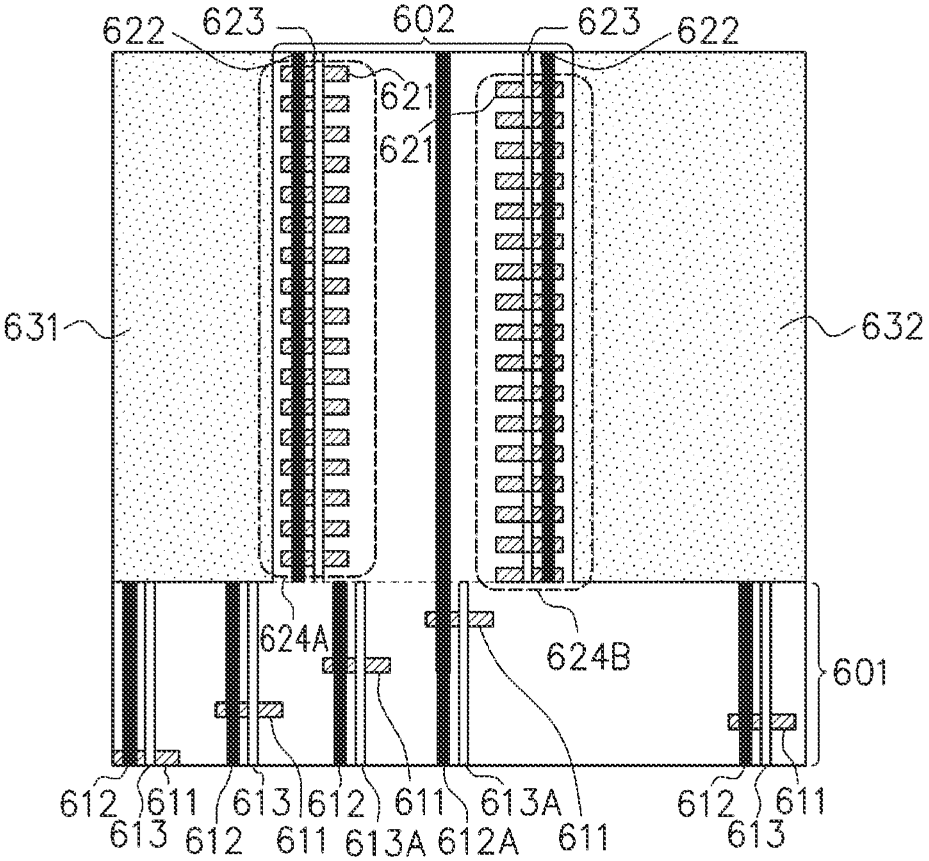
FIG. 6B is a view illustrating an example of the arrangement pattern in this embodiment.

Here, with reference to FIG. 6A and FIG. 6B, there is explained an example of processing to change the arrangement pattern to the arrangement pattern that is resistant to IR-Drop (that reduces the power supply voltage fluctuation). FIG. 6A illustrates an original arrangement pattern, and FIG. 6B illustrates an example of the arrangement pattern that is more resistant to IR-Drop than that in FIG. 6A. In FIG. 6A and FIG. 6B, 611 and 621 each denote a power switch circuit, 612 and 622 each denote a local power supply line, and 613 and 623 each denote a global power supply line. Further, 631 and 632 each denote a macro (for example, a memory macro).

In the original arrangement pattern illustrated in FIG. 6A, in an area 601 that is not a narrow area, the power switch circuits 611 are arranged in a staircase pattern in accordance with the first rule. Further, in a narrow area 602, the power switch circuits 621 are arranged in a column (624A) along one macro 631 in accordance with a rule different from the first rule. The local power supply line 612 and the global power supply line 613 are connected to the power switch circuit 611, and the local power supply line 622 and the global power supply line 623 are connected to the power switch circuit 621.

As illustrated in FIG. 6A, the local power supply line 612 connected to the power switch circuit 611 arranged in the area 601 is wired as long as it can be wired, and the global power supply line 613 connected to the power switch circuit 611 is wired only in the area 601. Therefore, in the arrangement pattern illustrated in FIG. 6A, a local power supply line 612A connected to the power switch circuit 611 is wired not only in the area 601 but also in the narrow area 602. On the other hand, a global power supply line 613A connected to the power switch circuit 611 can be wired even in the narrow area 602, but is wired only in the area 601. As above, the global power supply line 613, which is connected to the power switch circuit 611, is not wired in the narrow area 602, and thereby, wiring resources are secured.

In the arrangement pattern illustrated in FIG. 6B, in the area 601 that is not a narrow area, the power switch circuits 611 are arranged in a staircase pattern in accordance with the first rule, as in the arrangement pattern illustrated in FIG. 6A. Further, in the narrow area 602, the power switch circuits 621 are arranged in two columns (624A, 624B) along the macros 631, 632, respectively, in accordance with a rule different from the first rule. As in the arrangement pattern illustrated in FIG. 6A, the local power supply line 612 and the global power supply line 613 are connected to the power switch circuit 611, and the local power supply line 622 and the global power supply line 623 are connected to the power switch circuit 621.

Further, in the arrangement pattern illustrated in FIG. 6B, as in the arrangement pattern illustrated in FIG. 6A, the local power supply line 612 connected to the power switch circuit 611 arranged in the area 601 is wired as long as it can be wired, and the global power supply line 613 connected to the power switch circuit 611 is wired only in the area 601. Therefore, in the arrangement pattern illustrated in FIG. 6B, the local power supply line 612A connected to the power switch circuit 611 is wired not only in the area 601 but also in the narrow area 602. On the other hand, the global power supply line 613A connected to the power switch circuit 611 can be wired even in the narrow area 602, but is wired only in the area 601.

By arranging two columns of the power switch circuits 621 in the narrow area 602 as above, the IR-Drop (power supply voltage fluctuation) can be suppressed and reduced as compared to the arrangement pattern illustrated in FIG. 6A. On the other hand, the power supply lines are wired for two columns of the power switch circuits 621 and thus, the wiring resources are reduced.

Returning to the processing illustrated in FIG. 4B, after changing the arrangement pattern in the narrow area by pieces of the repetitive processing at steps S411 to S414, the processor performs power supply wiring (S415), performs rough arrangement and wiring of circuit cells (standard cells, or the like), signal lines, and the like (S416), and performs detection processing of wiring congestion (S417) in the same manner as at steps S406 to S408 described previously.

Then, at step S418, the processor determines whether or not there is wiring congestion in the narrow area. When determining that there is no wiring congestion in all the narrow areas (NO at step S418), the processor returns to step S411 and performs processing to change the arrangement pattern in the narrow area to the arrangement pattern that is more resistant to IR-Drop.

When determining that there is wiring congestion in at least one narrow area at Step S418 (YES), the processor proceeds to step S419, and determines and fixes the arrangement pattern in the narrow area by pieces of repetitive processing at steps S419 to S422. The processor changes the arrangement pattern in the narrow area to an arrangement pattern that is one before the arrangement pattern in which wiring congestion occurred at step S418, namely an arrangement pattern with larger wiring resources than the arrangement pattern in which wiring congestion occurred (S420), to fix the arrangement pattern in the target narrow area (S421). Then, the processor finishes the arrangement processing of the power switch circuits.

When determining that there is wiring congestion in at least one narrow area at step S409, the processor changes the arrangement pattern to the arrangement pattern with larger wiring resources than the current arrangement pattern for each of the narrow areas and arranges the power switch circuits by pieces of repetitive processing at steps S431 to S434. That is, the processor determines whether or not there is an arrangement pattern with larger wiring resources than the current arrangement pattern (S432). When determining that there is an arrangement pattern with larger wiring resources (YES at step S432), the processor arranges the power switch circuits in the narrow area in the arrangement pattern with larger wiring resources (S433). On the other hand, when determining that there is no arrangement pattern with larger wiring resources (NO at step S432), the processor finishes pieces of the repetitive processing at steps S431 to S434.

Figure 6C:
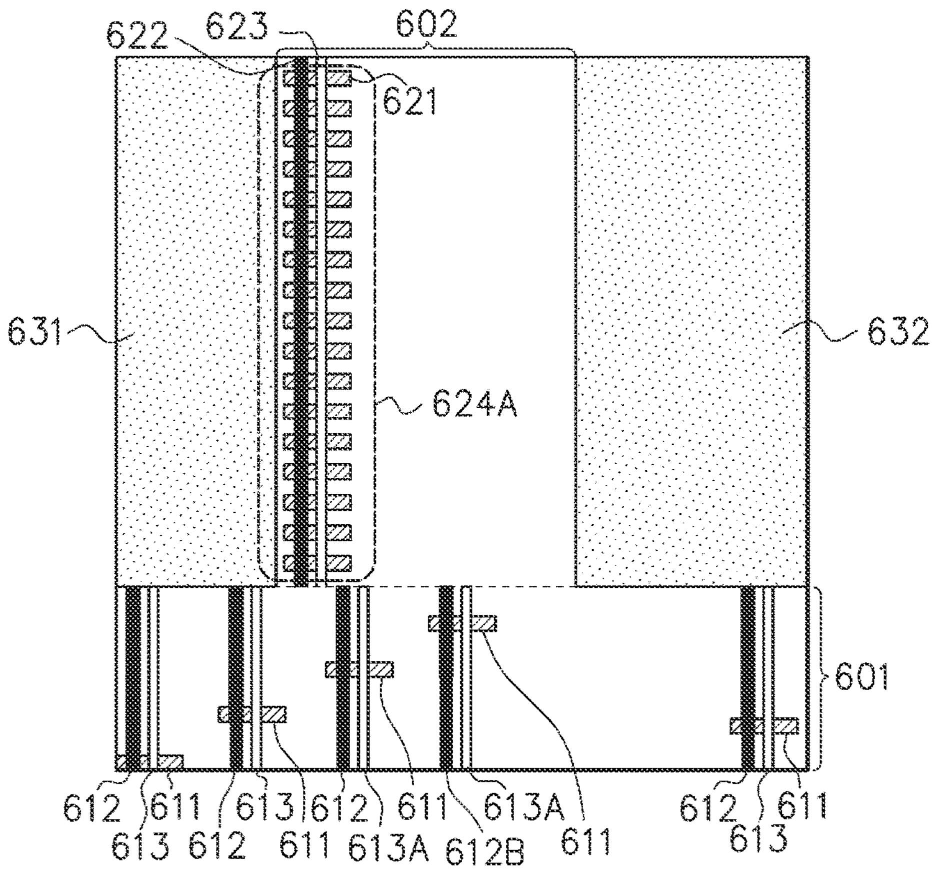
FIG. 6C is a view illustrating an example of the arrangement pattern in this embodiment.

Here, with reference to FIG. 6A and FIG. 6C, there is explained an example of the processing to change the arrangement pattern to the arrangement pattern with large wiring resources with reference to FIG. 6A and FIG. 6C. FIG. 6A illustrates the original arrangement pattern, and FIG. 6C illustrates an example of the arrangement pattern with larger wiring resources than that in FIG. 6A. The explanation of FIG. 6A is omitted here because FIG. 6A has already been explained. In FIG. 6C, 611 and 621 each denote a power switch circuit, 612 and 622 each denote a local power supply line, and 613 and 623 each denote a global power supply line. Further, 631 and 632 each denote a macro (for example, a memory macro).

In the arrangement pattern illustrated in FIG. 6C, in the area 601 that is not a narrow area, the power switch circuits 611 are arranged in a staircase pattern in accordance with the first rule, as in the arrangement pattern illustrated in FIG. 6A. Further, in the narrow area 602, the power switch circuits 621 are arranged in a column (624A) along one macro 631 in accordance with a rule different from the first rule, as in the arrangement pattern illustrated in FIG. 6A. The local power supply line 612 and the global power supply line 613 are connected to the power switch circuit 611, and the local power supply line 622 and the global power supply line 623 are connected to the power switch circuit 621.

In the arrangement pattern illustrated in FIG. 6C, the local power supply line 612 and the global power supply line 613, which are connected to the power switch circuit 611 arranged in the area 601, are wired only in the area 601. Therefore, in the arrangement pattern illustrated in FIG. 6C, a local power supply line 612B and the global power supply line 613A, which are connected to the power switch circuit 611, can be wired even in the narrow area 602, but are wired only in the area 601. As above, the local power supply line 612 and the global power supply line 613, which are connected to the power switch circuit 611, are not wired in the narrow area 602, and thereby, wiring resources larger than those of the arrangement pattern illustrated in FIG. 6A are secured.

Returning to the processing illustrated in FIG. 4B, after changing the arrangement pattern in the narrow area by pieces of the repetitive processing at steps S431 to S434, the processor performs power supply wiring (S435), performs rough arrangement and wiring of circuit cells (standard cells, or the like), signal lines, and the like (S436), and performs detection processing of wiring congestion (S437) in the same manner as at steps S406 to S408 described previously.

Then, at step S438, the processor determines whether or not there is wiring congestion in the narrow area. When determining that there is wiring congestion in at least one narrow area (YES at step S438), the processor returns to step S431, and performs processing to change the arrangement pattern in the narrow area to the arrangement pattern with larger wiring resources.

When determining that there is no wiring congestion in all the narrow areas at step S438 (NO), the processor proceeds to step S439 to determine and fix the arrangement pattern in the narrow area by pieces of repetitive processing at steps S439 to S441.

The processor fixes the arrangement pattern at the time when determining that there is no wiring congestion in all the narrow areas as the arrangement pattern in the target narrow area (S440). Then, the processor finishes the arrangement processing of the power switch circuits.

Incidentally, in the previously-described embodiment, the narrow area list is created by the narrow area detection processing, and after all the narrow areas are listed, the processing of the initial arrangement of the power switch circuits and the processing of changing the arrangement pattern are executed, but the previously-described embodiment is not limited to this, and the processing to arrange the power switch circuits and the processing to change the pattern may be sequentially executed as each narrow area is detected without listing the narrow areas.

As above, in the first embodiment, when there is no wiring congestion in the narrow area in the initial arrangement pattern, the processor searches for the arrangement pattern that is more resistant to IR-Drop (with a smaller power supply voltage fluctuation) within a range that does not cause wiring congestion. The processor updates the arrangement pattern to the arrangement pattern that is more resistant to IR-Drop until wiring congestion occurs in the narrow area, and when wiring congestion occurs, the processor changes the arrangement pattern to the previous arrangement pattern with larger wiring resources and fixes the arrangement pattern in the narrow area. When there is no candidate arrangement pattern to be updated, the processor fixes the current arrangement pattern.

On the other hand, when there is wiring congestion in the narrow area in the initial arrangement pattern, the processor searches for the arrangement pattern with larger wiring resources. The processor updates the arrangement pattern to the arrangement pattern with larger wiring resources in the narrow area, and fixes the arrangement pattern in which the degree of wiring congestion is reduced as the arrangement pattern in the narrow area. When there is no candidate arrangement pattern to be updated, the processor fixes the current arrangement pattern.

As above, according to the first embodiment, it is possible to properly arrange the power switch circuits while considering the constraints (criteria) of the power supply voltage fluctuation (IR-Drop) and the wiring resources. By performing the arrangement in consideration of the constraints (criteria) of the power supply voltage fluctuation (IR-Drop) and the wiring resources, it is possible to inhibit the occurrence of rework working in the process of designing the semiconductor integrated circuit device.

Second Embodiment

Next, there is explained a second embodiment.

In the first embodiment described previously, the power switch circuits are arranged in the same arrangement pattern in all the narrow areas within the circuit arrangement area of the semiconductor integrated circuit device. In the second embodiment to be explained below, the arrangement pattern of the power switch circuits is individually determined for each narrow area, and the power switch circuits are arranged in each narrow area in an arrangement pattern that is independent of the other narrow areas. In the second embodiment, it becomes possible to arrange the power switch circuits in a proper arrangement pattern in each narrow area within the circuit arrangement area.

Figure 5A:
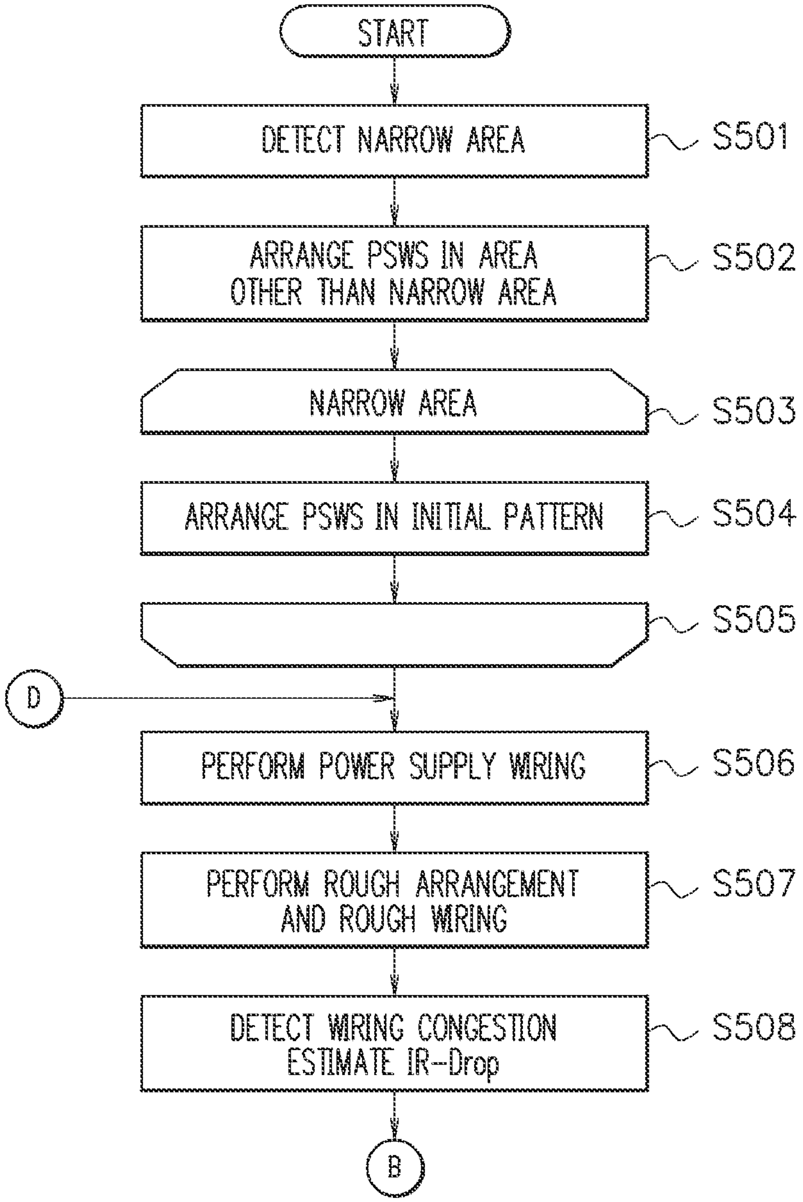
FIG. 5A is a flowchart illustrating an example of arrangement processing of power switch circuits in a second embodiment.
Figure 5B:
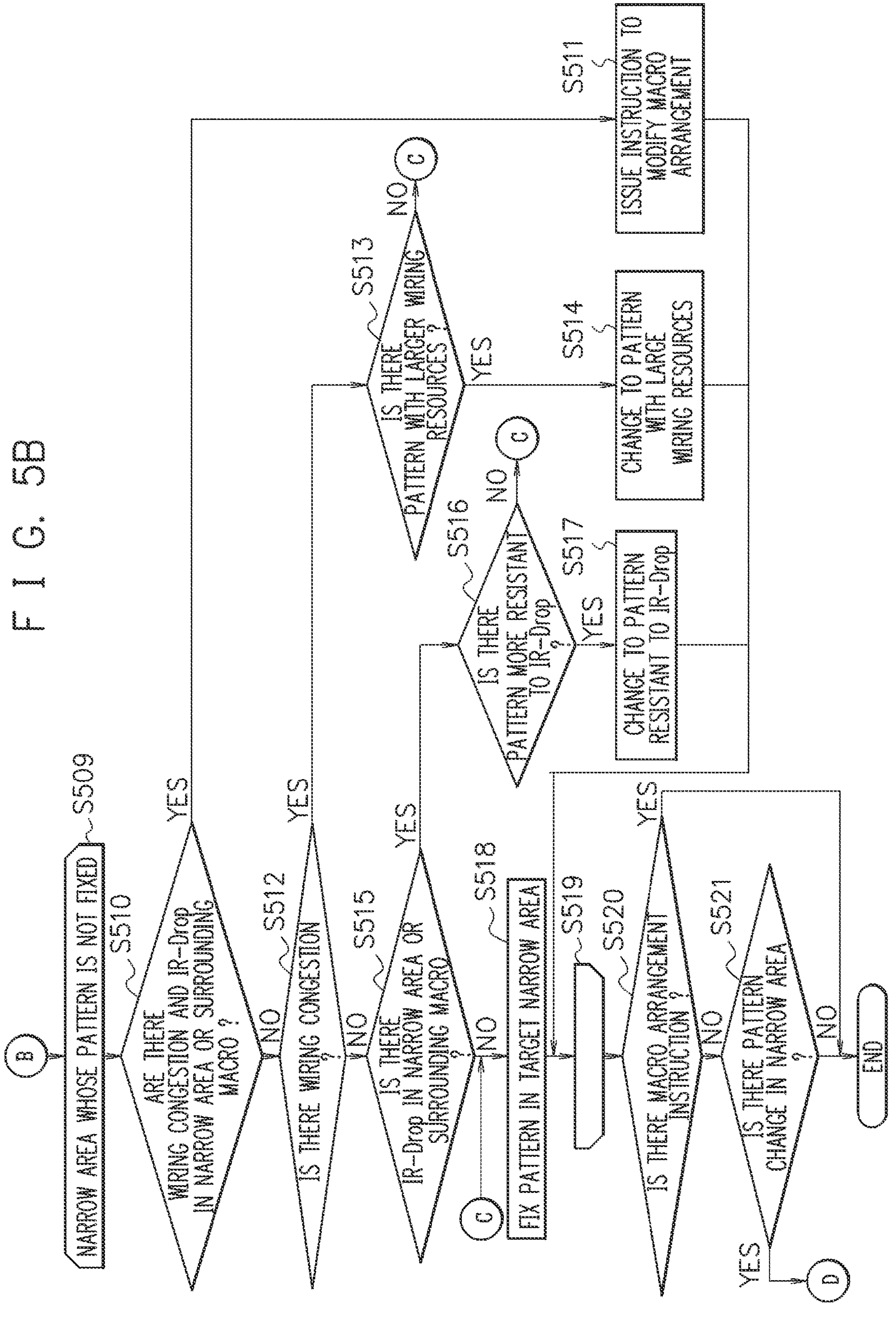
FIG. 5B is a flowchart illustrating an example of the arrangement processing of the power switch circuits in the second embodiment.

Pieces of processing other than the arrangement processing of the power switch circuits in the second embodiment are the same as those in the first embodiment described previously, and thus, their explanation of the second embodiment is omitted, and the arrangement processing of the power switch circuits in the second embodiment will be explained below. FIG. 5A and FIG. 5B each are a flowchart illustrating an example of the arrangement processing of the power switch circuits in the second embodiment.

At step S501, the processor detects a narrow area in the circuit arrangement area of the semiconductor integrated circuit device in which the macros (functional circuits) are arranged, as illustrated in FIG. 2, for example.

At Step s502, the processor refers to the narrow area list and arranges the power switch circuits in accordance with the first rule in the area other than the narrow area of the area with no arrangement of macros (standard cell arrangement area) within the circuit arrangement area. The arrangement pattern of the power switch circuits in accordance with the first rule is such a staircase arrangement pattern as illustrated in FIG. 9A, for example.

Further, by pieces of repetitive processing at steps S503 to S505, the processor arranges the power switch circuits in the initial arrangement pattern in each of the narrow areas of the area with no arrangement of macros (standard cell arrangement area) within the circuit arrangement area. The initial arrangement pattern is an arrangement pattern in accordance with a rule different from the arrangement pattern of the power switch circuits in accordance with the first rule.

Incidentally, the order in which the power switch circuits are arranged is arbitrary at steps S502 to S505, and after the power switch circuits are arranged in the narrow area, the power switch circuits may be arranged in the area other than the narrow area.

After arranging the power switch circuits in the area other than the narrow area and the narrow area, the processor performs power supply wiring related to the power switch circuits, and the like (S506), performs rough arrangement and wiring of circuit cells (standard cells, or the like), signal lines, and the like in the standard cell arrangement area within the circuit arrangement area (S507), and performs detection processing of wiring congestion and estimation of IR-Drop (power supply voltage fluctuation) (S508). The detection processing of wiring congestion and the estimation processing of power supply voltage fluctuation (IR-Drop) may be performed using well-known techniques.

After performing the detection processing of wiring congestion and the estimation processing of IR-Drop (power supply voltage fluctuation), the processor executes pieces of processing at steps S509 to S519 on the narrow areas whose arrangement patterns are not fixed for each narrow area. At step S509, the processor selects one processing target narrow area from among the narrow areas whose arrangement patterns are not fixed.

Then, at step S510, the processor determines whether or not there are wiring congestion in the processing target narrow area and IR-Drop (power supply voltage fluctuation), which is a constraint violation (criteria violation), in the narrow area or the surrounding macro. When determining that there is wiring congestion in the processing target narrow area and there is IR-Drop, which is a constraint violation, in the narrow area or the surrounding macro (YES at step S510), the processor proceeds to step S511, and in the other cases (NO at step S510), the processor proceeds to step S512.

There are wiring congestion and IR-Drop that is a constraint violation and changing the arrangement pattern related to the power switch circuit alone is insufficient, and therefore, at step S511, the processor issues an instruction to modify the arrangement of macros for the processing target narrow area. Then, the processor proceeds to step S519.

At step S512, the processor determines whether or not there is wiring congestion in the processing target narrow area. When determining that there is wiring congestion in the processing target narrow area (YES at step S512), the processor proceeds to step S513. When determining that there is no wiring congestion in the processing target narrow area (NO at step S512), the processor proceeds to step S515.

At step S513, the processor determines whether or not there is an arrangement pattern with larger wiring resources than the current arrangement pattern. That is, the processor determines whether or not there is an arrangement pattern with larger wiring resources. When determining that there is an arrangement pattern with larger wiring resources (YES at step S513), the processor proceeds to step S514. On the other hand, when determining that there is no arrangement pattern with larger wiring resources (NO at step S513), the processor proceeds to step S518 because there is no arrangement pattern to be a change candidate.

At step S514, the processor changes the arrangement pattern in the processing target narrow area to the arrangement pattern with large wiring resources, and proceeds to step S519. The example of processing to change the arrangement pattern to the arrangement pattern with large wiring resources is as explained in the first embodiment with reference to FIG. 6A and FIG. 6C.

At step S515, the processor determines whether or not there is IR-Drop, which is a constraint violation, in the processing target narrow area or the surrounding macro. When determining that there is IR-Drop, which is a constraint violation (YES at step S515), the processor proceeds to step S516. When determining that there is no IR-Drop, which is a constraint violation (NO at step S515), the processor proceeds to step S518.

At step S516, the processor determines whether or not there is an arrangement pattern that is more resistant to IR-Drop than the current arrangement pattern. That is, the processor determines whether or not there is an arrangement pattern that is more resistant to IR-Drop. When determining that there is an arrangement pattern that is more resistant to IR-Drop (YES at step S516), the processor proceeds to step S517. On the other hand, when determining that there is no arrangement pattern that is more resistant to IR-Drop (NO at step S516), the processor proceeds to step S518 because there is no arrangement pattern to be a change candidate.

At step S517, the processor changes the arrangement pattern in the processing target narrow area to the arrangement pattern that is resistant to IR-Drop and proceeds to step S519. The example of processing to change the arrangement pattern to the arrangement pattern that is resistant to IR-Drop is as explained in the first embodiment with reference to FIG. 6A and FIG. 6B.

At step S518, the processor fixes the arrangement pattern in the processing target narrow area to the current arrangement pattern because there is no arrangement pattern to be a change candidate for the processing target narrow area. Then, the processor proceeds to step S519.

When there is an unprocessed narrow area among the narrow areas whose arrangement patterns are not fixed at step S519, the processor returns to step S509, and when there is no unprocessed narrow area, the processor proceeds to step S520.

At step S520, the processor determines whether or not there is an instruction to modify the arrangement of macros. When determining that there is an instruction to modify the arrangement of macros (YES at step S520), the processor finishes the processing and returns to the step to arrange macros. When determining that there is no instruction to modify the arrangement of macros (NO at step S520), the processor proceeds to step S521.

At step S521, the processor determines whether or not the arrangement pattern has been changed in any of the narrow areas. When determining that the arrangement pattern has been changed in any of the narrow areas (YES at step S521), the processor returns to step S506 and executes pieces of the processing at and after S506 again. On the other hand, when determining that the arrangement pattern has not been changed in any of the narrow areas (NO at step S521), the processor determines that the arrangement pattern has been fixed in all the narrow areas, and finishes the processing.

In the second embodiment, when any one of the wiring congestion and the IR-Drop (power supply voltage fluctuation), which is a constraint violation (criteria violation), is confirmed in the narrow area, the processor changes the arrangement pattern to an arrangement pattern intended for improving it. When there is wiring congestion in the narrow area, the processor changes the arrangement pattern to the arrangement pattern with large wiring resources, and when there is IR-drop, which is a constraint violation, the processor changes the arrangement pattern to the arrangement pattern that is resistant to IR-drop. When there is no arrangement pattern to be a change candidate, the processor fixes the current arrangement pattern. Further, when both the wiring congestion and the IR-Drop, which is a constraint violation, are confirmed in the narrow area, the processor issues an instruction to modify the arrangement of macros because changing the arrangement pattern alone is insufficient. The processor performs this processing for each narrow area within the circuit arrangement area.

As above, it becomes possible to properly arrange the power switch circuits while considering the constraints (criteria) of the power supply voltage fluctuation (IR-Drop) and the wiring resources for each narrow area. By performing the arrangement in consideration of the constraints (criteria) of the power supply voltage fluctuation (IR-Drop) and the wiring resources, it is possible to inhibit the occurrence of rework working in the process of designing the semiconductor integrated circuit device.

Third Embodiment

Figure 7:
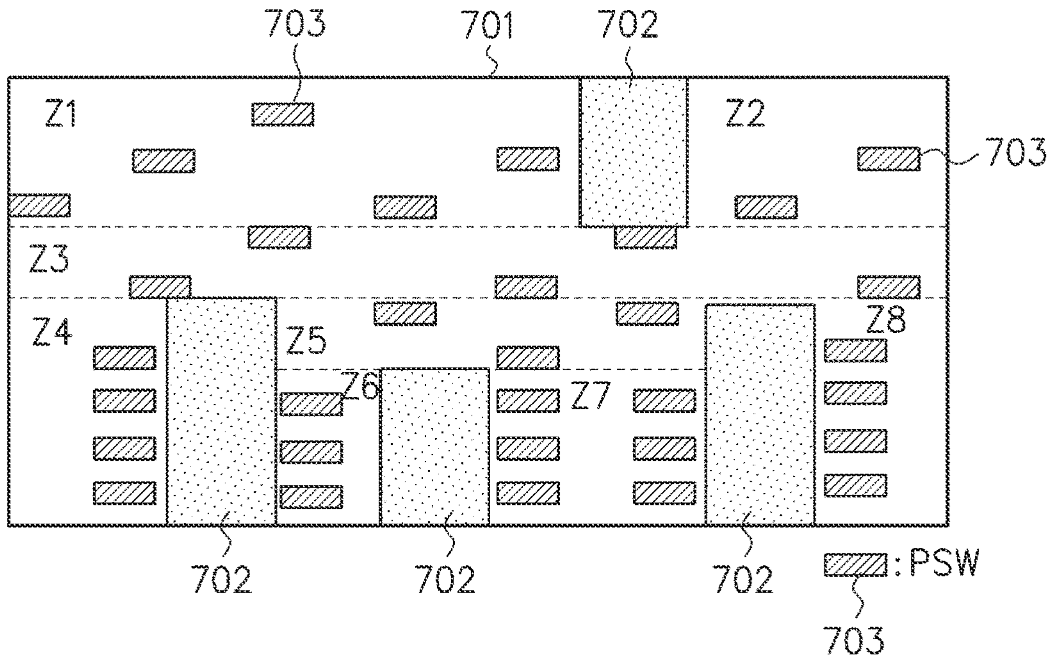
FIG. 7 is a view explaining an example of a semiconductor integrated circuit device in this embodiment.

FIG. 7 is a view explaining an example of a semiconductor integrated circuit device having a layout corresponding to the previously-described designing method of the semiconductor integrated circuit device. Within a circuit arrangement area 701 of the semiconductor integrated circuit device, macros 702 are arranged, and in an area with no arrangement of the macros 702 (standard cell arrangement area) within the circuit arrangement area 701, power switch circuits (PSW) 703 are arranged. In areas (areas other than narrow areas) Z1, Z2, Z3, and Z5 where the width of the divided area is equal to or more than the narrow area criterion width, the power switch circuits 703 are arranged in accordance with the first rule (in a staircase arrangement pattern as an example). In areas (narrow areas) Z4, Z6, Z7, and Z8 where the width of the divided area is less than the narrow area criterion width, the power switch circuits 703 are arranged in accordance with a rule different from the first rule (in a column arrangement pattern as an example).

Incidentally, in the previously-described embodiments, the arrangement pattern illustrated in FIG. 6A is set as an example of the original arrangement pattern, and FIG. 6B and FIG. 6C illustrate one example of the arrangement pattern that is more resistant to IR-Drop and one example of the arrangement pattern with larger wiring resources respectively, but the previously-described embodiments are not limited to these. A larger number of arrangement patterns that are different in the resistance to IR-Drop and the wiring resource amount may be prepared, and in consideration of IR-Drop and wiring characteristics, a sequence may be assigned to the arrangement patterns, and then the arrangement patterns may be applied.

Further, the designing method of the semiconductor integrated circuit device in the embodiments described previously can be implemented by a computer, which includes, for example, a CPU (Central Processing Unit) or MPU (Micro Processing Unit), a RAM (Random Access Memory), a ROM (Read Only Memory), and so on, executing a program stored in its storage unit, and the aforementioned program is included in an embodiment. Further, the designing method of the semiconductor integrated circuit device can be implemented by recording the program that causes the computer to execute each of pieces of the processing of the designing method of the semiconductor integrated circuit device in a non-transitory computer-readable recording medium, such as a CD-ROM, for example, and by causing the computer to read the program, and the non-transitory computer-readable recording medium in which the aforementioned program is recorded is included in an embodiment. As the non-transitory computer-readable recording medium that records the aforementioned program, a flexible disk, a hard disk, a magnetic tape, a magnetic-optical disk, a nonvolatile memory card, and so on can be used other than the CD-ROM.

Further, a program product in which pieces of the processing of the designing method of the semiconductor integrated circuit device described previously are implemented by the computer executing the program and performing processing is included in an embodiment. As the aforementioned program product, there are a program itself that implements pieces of the processing of the designing method of the semiconductor integrated circuit device described previously and a computer by which the aforementioned program is read. Further, as the aforementioned program product, there are a transmitting device capable of providing the aforementioned program to a computer connected to be able to communicate via a network, a network system that is provided with the transmitting device, and so on.

Further, also in the case where pieces of the processing of the designing method of the semiconductor integrated circuit device described previously are implemented in cooperation with an OS (operating system), other application software, or the like in which a provided program runs on a computer, the program is included in an embodiment. Further, also in the case where the whole or a part of processing of the provided program is performed by a function expansion board or a function expansion unit in the computer and thereby pieces of the processing of the designing method of the semiconductor integrated circuit device described previously are implemented, the program is included in an embodiment. Further, in order to utilize the embodiments in a network environment, all or a part of the programs may be executed by other computers.

Figure 8:
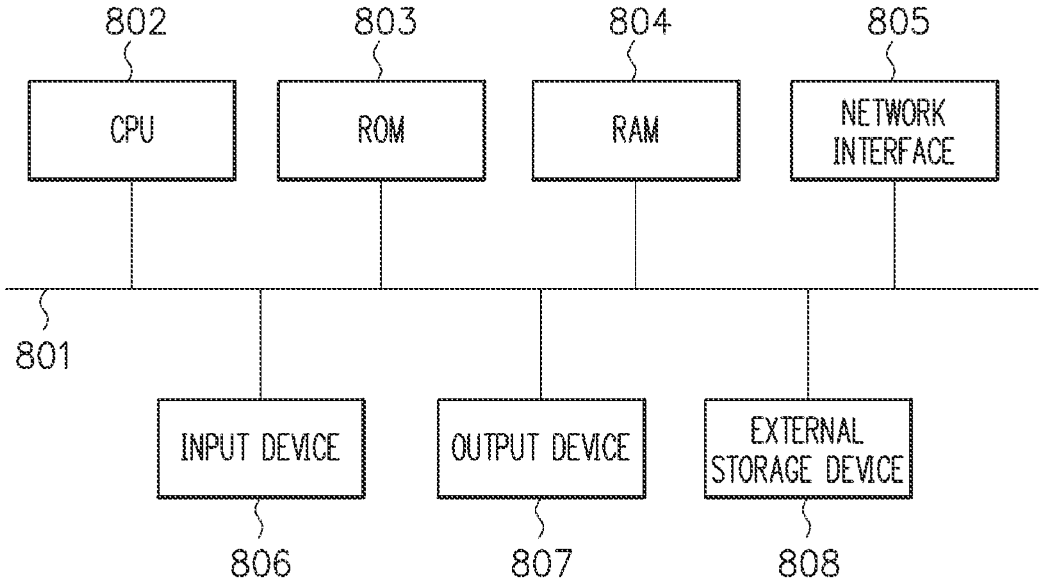
FIG. 8 is a view illustrating a configuration example of a computer capable of implementing the designing method of the semiconductor integrated circuit device in this embodiment.

For example, the designing method of the semiconductor integrated circuit device in the previously-described embodiments can be implemented by such a computer (designing device) as illustrated in FIG. 8, and the operations of the designing method of the semiconductor integrated circuit device in the previously-described embodiments are performed by its CPU. FIG. 8 is a diagram illustrating a configuration example of the computer to be able to implement the designing method of the semiconductor integrated circuit device in this embodiment. A CPU 802, a ROM 803, a RAM 804, a network interface 805, an input device 806, an output device 807, and an external storage device 808 are connected to a bus 801.

The CPU 802 controls each of the components connected thereto via the bus 801 as well as performs data processing and operation. In the ROM 803, a boot program is stored in advance, and the CPU 802 executes this boot program, and thereby the computer is activated. A computer program is stored in the external storage device 808, and the computer program is copied to the RAM 804 and executed by the CPU 802, and thereby, for example, each of pieces of the processing of the designing method of the semiconductor integrated circuit device described previously, and the like are performed. The RAM 804 is used as a work memory for input/output or transmission/reception of the data, and temporary storage for control of each of the components.

The external storage device 808 is, for example, a hard disk drive (HDD), a solid state drive (SSD), a CD-ROM, or the like, and storage contents therein are not erased even when power supply is cut off. The network interface 805 is an interface for connecting to the network. The input device 806 is, for example, a keyboard, a pointing device (mouse), or the like, and can perform various kinds of designation, input, and the like. The output device 807 is a display, a printer, or the like, and can perform display, printing, and the like.

Further, the above embodiments merely illustrate concrete examples of implementing the present invention, and the technical scope of the present invention is not to be construed in a restrictive manner by these embodiments. That is, the present invention may be implemented in various forms without departing from the technical spirit or main features thereof.

The disclosed designing method of the semiconductor integrated circuit device can properly arrange power switch circuits.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

According to the embodiments, it is possible to provide a designing method of a semiconductor integrated circuit device that properly arranges power switch circuits in a circuit arrangement area of the semiconductor integrated circuit device.

What is claimed is:

1. A designing method of a semiconductor integrated circuit device including a power domain in which control related to power supply is configured to be performed, the designing method comprising:

generating layout data representing a layout of the semiconductor integrated circuit device by:

arranging a plurality of macros, which are designed circuit blocks each configured to implement a certain function, within a circuit arrangement area of the semiconductor integrated circuit device in which a plurality of power switch circuits each of which controls whether or not to electrically connect a global power supply line supplying power and a local power supply line provided for the power domain are to be arranged in accordance with a first rule;

detecting a narrow area from a first area, a width of the narrow area being less than a first value, the first area being an area in which the macros are not arranged within the circuit arrangement area;

arranging the power switch circuits in the detected narrow area in accordance with a second rule different from the first rule; and arranging the power switch circuits in an area other than the narrow area within the first area in accordance with the first rule, and outputting the generated layout data so that the semiconductor integrated circuit device having the layout represented by the generated layout data is formable based on the generated layout data.

2. The designing method of the semiconductor integrated circuit device according to claim 1, wherein the first value is a value defined based on at least one of a width of the power switch circuit and an arrangement interval between the power switch circuits arranged in accordance with the first rule.

3. The designing method of the semiconductor integrated circuit device according to claim 1, wherein when the power switch circuits are arranged in the narrow area in a first arrangement pattern and wiring congestion occurs, the power switch circuits are arranged by changing the first arrangement pattern to a second arrangement pattern with larger wiring resources than the first arrangement pattern.

4. The designing method of the semiconductor integrated circuit device according to claim 1, wherein when the power switch circuits are arranged in the narrow area in a first arrangement pattern and a power supply voltage fluctuation, which is a constraint violation, occurs, the power switch circuits are arranged by changing the first arrangement pattern to a third arrangement pattern in which the power supply voltage fluctuation is suppressed more than the first arrangement pattern.

5. The designing method of the semiconductor integrated circuit device according to claim 1, wherein the detecting the narrow area is performed by dividing the first area into a plurality of rectangular areas based on the arranged macros.

6. The designing method of the semiconductor integrated circuit device according to claim 1, wherein the power switch circuits are arranged in the same arrangement pattern in all the detected narrow areas.

7. The designing method of the semiconductor integrated circuit device according to claim 1, wherein when the power switch circuits are arranged in the narrow area in a first arrangement pattern and wiring congestion does not occur, the power switch circuits are arranged by changing the first arrangement pattern to a fourth arrangement pattern in which the power supply voltage fluctuation is suppressed more than the first arrangement pattern.

8. The designing method of the semiconductor integrated circuit device according to claim 1, wherein in each of the detected narrow areas, the power switch circuits are arranged in an arrangement pattern that does not depend on the other narrow areas.

9. A semiconductor integrated circuit device including a circuit arrangement area, the semiconductor integrated circuit device comprising:

a plurality of macros that are arranged in the circuit arrangement area;

a plurality of first power switch circuits that are arranged in a first arrangement pattern in an area other than a narrow area within a first area, a width of the narrow area being less than a first value, the first area being an area in which the macros are not arranged within the circuit arrangement area; and a plurality of second power switch circuits that are arranged in the narrow area within the first area in a second arrangement pattern different from the first arrangement pattern.

10. The semiconductor integrated circuit device according to claim 9, wherein the first value is a value defined based on at least one of a width of the first power switch circuit and an arrangement interval between the first power switch circuits arranged in the first arrangement pattern.

11. The semiconductor integrated circuit device according to claim 9, wherein the second power switch circuits are arranged in all the narrow areas in the same arrangement pattern.

12. The semiconductor integrated circuit device according to claim 9, wherein the second power switch circuits are arranged in an arrangement pattern that does not depend on the other narrow areas in each of the narrow areas.

13. A non-transitory computer-readable recording medium which records a program for causing a computer to execute:

generating layout data representing a layout of the semiconductor integrated circuit device by:

arranging a plurality of macros, which are designed circuit blocks each configured to implement a certain function, within a circuit arrangement area of a semiconductor integrated circuit device including a power domain in which control related to power supply is configured to be performed, in which a plurality of power switch circuits each of which controls whether or not to electrically connect a global power supply line supplying power and a local power supply line provided for the power domain are to be arranged in accordance with a first rule;

detecting a narrow area from a first area, a width of the narrow area being less than a first value, the first area being an area in which the macros are not arranged within the circuit arrangement area;

arranging the power switch circuits in the detected narrow area in accordance with a second rule different from the first rule; and arranging the power switch circuits in an area other than the narrow area within the first area in accordance with the first rule, and outputting the generated layout data so that the semiconductor integrated circuit device having the layout represented by the generated layout data is formable based on the generated layout data.

14. The non-transitory computer-readable recording medium according to claim 13, wherein the first value is a value defined based on at least one of a width of the power switch circuit and an arrangement interval between the power switch circuits arranged in accordance with the first rule.

15. The non-transitory computer-readable recording medium according to claim 13, wherein in the arranging the power switch circuits in the narrow area, when the power switch circuits are arranged in the narrow area in a first arrangement pattern and wiring congestion occurs, the power switch circuits are arranged by changing the first arrangement pattern to a second arrangement pattern with larger wiring resources than the first arrangement pattern.

16. The non-transitory computer-readable recording medium according to claim 13, wherein in the arranging the power switch circuits in the narrow area, when the power switch circuits are arranged in the narrow area in a first arrangement pattern and a power supply voltage fluctuation, which is a constraint violation, occurs, the power switch circuits are arranged by changing the first arrangement pattern to a third arrangement pattern in which the power supply voltage fluctuation is suppressed more than the first arrangement pattern.

17. The non-transitory computer-readable recording medium according to claim 13, wherein the detecting the narrow area is performed by dividing the first area into a plurality of rectangular areas based on the arranged macros.

18. The non-transitory computer-readable recording medium according to claim 13, wherein in the arranging the power switch circuits in the narrow area, the power switch circuits are arranged in the same arrangement pattern in all the detected narrow areas.

19. The non-transitory computer-readable recording medium according to claim 13, wherein in the arranging the power switch circuits in the narrow area, when the power switch circuits are arranged in the narrow area in a first arrangement pattern and wiring congestion does not occur, the power switch circuits are arranged by changing the first arrangement pattern to a fourth arrangement pattern in which the power supply voltage fluctuation is suppressed more than the first arrangement pattern.

20. The non-transitory computer-readable recording medium according to claim 13, wherein in the arranging the power switch circuits in the narrow area, in each of the detected narrow areas, the power switch circuits are arranged in an arrangement pattern that does not depend on the other narrow areas.

* * * * *